(12) United States Patent
Park et al.

(10) Patent No.: US 10,408,421 B2
(45) Date of Patent: Sep. 10, 2019

(54) LIGHT EMITTING APPARATUS

(71) Applicant: LG Innotek Co., Ltd., Seoul (KR)

(72) Inventors: Kang Yeol Park, Seoul (KR); Ki Cheol Kim, Seoul (KR); Chang Gyun Son, Seoul (KR)

(73) Assignee: LG INNOTEK CO, LTD., Seoul (KR)

(*) Notice: Subject to any disclaimer, the term of this patent is extended or adjusted under 35 U.S.C. 154(b) by 0 days.

(21) Appl. No.: 15/547,771

(22) PCT Filed: Dec. 21, 2015

(86) PCT No.: PCT/KR2015/013993
§ 371 (c)(1),
(2) Date: Jul. 31, 2017

(87) PCT Pub. No.: WO2016/126005
PCT Pub. Date: Aug. 11, 2016

(65) Prior Publication Data
US 2018/0023781 A1    Jan. 25, 2018

(30) Foreign Application Priority Data

Feb. 3, 2015 (KR) .................. 10-2015-0017029

(51) Int. Cl.
*F21K 9/64* (2016.01)
*F21V 7/00* (2006.01)
(Continued)

(52) U.S. Cl.
CPC .......... *F21V 7/0033* (2013.01); *F21S 41/143* (2018.01); *F21S 41/151* (2018.01); *F21S 41/16* (2018.01);
(Continued)

(58) Field of Classification Search
CPC ...... F21S 41/365; F21S 41/321; F21S 41/285; F21S 41/33; F21S 41/338; F21V 13/04; F21V 7/09
See application file for complete search history.

(56) References Cited

U.S. PATENT DOCUMENTS 9,793,680 B2 * 10/2017 Okada .................. F21V 3/061
10,044,169 B2 * 8/2018 Okada .................. F21V 3/061
(Continued)

FOREIGN PATENT DOCUMENTS

CN    101836160 A    9/2010
CN    102155639 A    8/2011
(Continued)

OTHER PUBLICATIONS

International Search Report in International Application No. PCT/KR2015/013993, filed Dec. 21, 2015.
(Continued)

*Primary Examiner* — William N Harris
(74) *Attorney, Agent, or Firm* — Saliwanchik, Lloyd & Eisenschenk

(57) ABSTRACT

A light emitting device apparatus of an embodiment comprises: a light source unit for emitting a plurality of excitation lights having linearity; a first reflection unit which reflects the plurality of excitation lights having linearity and incident to an incident direction parallel to an axis of symmetry, and collects the plurality of excitation lights to a focus position; and a wavelength conversion unit which is arranged on the focus position and transmits the plurality of excitation lights reflected and collected by the first reflection unit.

20 Claims, 9 Drawing Sheets

(51) Int. Cl.
*F21V 7/06* (2006.01)
*F21V 9/30* (2018.01)
*F21S 41/16* (2018.01)
*F21S 41/19* (2018.01)
*F21S 41/20* (2018.01)
*F21S 41/32* (2018.01)
*F21S 45/47* (2018.01)
*F21S 45/49* (2018.01)
*F21V 13/04* (2006.01)
*H01L 33/50* (2010.01)
*H01L 33/58* (2010.01)
*F21S 41/143* (2018.01)
*F21S 41/151* (2018.01)
*F21S 41/365* (2018.01)
*F21Y 115/00* (2016.01)
*F21Y 115/10* (2016.01)
*F21Y 115/30* (2016.01)

(52) U.S. Cl.
CPC ............ *F21S 41/19* (2018.01); *F21S 41/285* (2018.01); *F21S 41/321* (2018.01); *F21S 41/365* (2018.01); *F21S 45/47* (2018.01); *F21S 45/49* (2018.01); *F21V 7/06* (2013.01); *F21V 9/30* (2018.02); *F21V 13/04* (2013.01); *H01L 33/50* (2013.01); *H01L 33/58* (2013.01); *F21K 9/64* (2016.08); *F21Y 2115/00* (2016.08); *F21Y 2115/10* (2016.08); *F21Y 2115/30* (2016.08)

(56) References Cited

U.S. PATENT DOCUMENTS

| | | | | |
|---|---|---|---|---|
| 10,079,470 B2* | 9/2018 | Kozuru | ................... | H01S 5/005 |
| 2006/0087860 A1* | 4/2006 | Ishida | .................. | F21S 43/247 |
| | | | | 362/517 |
| 2007/0086202 A1* | 4/2007 | Tsukamoto | ........... | F21S 41/147 |
| | | | | 362/514 |
| 2012/0106188 A1 | 5/2012 | Takahashi et al. | | |
| 2012/0243203 A1* | 9/2012 | Koike | ..................... | F21S 41/14 |
| | | | | 362/19 |
| 2014/0233253 A1* | 8/2014 | Owada | .................. | F21S 41/147 |
| | | | | 362/516 |
| 2014/0268846 A1* | 9/2014 | Nakazato | ............. | F21S 48/1145 |
| | | | | 362/510 |
| 2017/0016586 A1 | 1/2017 | Tsuda et al. | | |

FOREIGN PATENT DOCUMENTS

| | | |
|---|---|---|
| CN | 102216848 A | 10/2011 |
| CN | 102563483 A | 7/2012 |
| DE | 102014211478 A1 | 12/2014 |
| JP | 2010-232044 A | 10/2010 |
| JP | 2011-165555 A | 8/2011 |
| JP | 2012-128340 A | 7/2012 |
| JP | 2012-203995 A | 10/2012 |
| JP | 2014-022084 A | 2/2014 |
| KR | 10-2010-0118346 A | 11/2010 |
| WO | WO 2009/131126 A1 | 10/2009 |
| WO | WO 2014/192338 A1 | 12/2014 |
| WO | WO 2015/170696 A1 | 11/2015 |

OTHER PUBLICATIONS

Supplementary European Search Report dated Jan. 3, 2018 in European Application No. 15881323.8.
Office Action dated Nov. 2, 2018 in Chinese Application No. 201580075335.2, along with its English translation.

* cited by examiner

LIGHT EMITTING APPARATUS

CROSS-REFERENCE TO RELATED APPLICATIONS

This application is the U.S. national stage application of International Patent Application No. PCT/KR2015/013993, filed Dec. 21, 2015, which claims priority to Korean Patent Application No. 10-2015-0017029, filed Feb. 3, 2015, the disclosures of each of which are incorporated herein by reference in their entirety.

TECHNICAL FIELD

Embodiments relate to a light emitting apparatus.

BACKGROUND ART

Light emitting diodes (LEDs) are a kind of semiconductor device that sends and receives a signal by converting electricity into infrared light using the characteristics of compound semiconductors or that is used as a light source.

A group III-V nitride semiconductor has been in the spotlight as the core of light emitting devices, such as light emitting diodes (LEDs) or laser diodes (LDs), due to the physical and chemical characteristics thereof.

Light emitting diodes and laser diodes do not contain environmentally hazardous substances, such as mercury (Hg), which are used in conventional lighting apparatuses, such as incandescent lamps or fluorescent lamps. Consequently, light emitting diodes and laser diodes are environmentally friendly. In addition, the light emitting diodes and the laser diodes exhibit long life spans and low power consumption. As a result, light emitting diodes or laser diodes have replaced conventional light sources.

In particular, the light emitting devices have been increasingly used in various fields, such as those of a headlamp for vehicles or a flashlight. A light emitting apparatus including light emitting devices is required to exhibit high optical extraction efficiency. In addition, demand for reduced size, weight, and cost thereof has continuously increased.

In the case in which a conventional light emitting apparatus includes a plurality of light sources, an optical system having a complicated structure is essentially required. That is, a collimating lens must be assigned to each of the light sources, and a focusing lens for collecting light beams collimated by the collimating lenses on a point is required. In general, light beams emitted from the light sources and then collimated may be spaced apart from each other by a large distance. In order to focus the light beams spaced apart from each other using a single focusing lens, it is required for the focusing lens to have a size of several tens of mm or more. If the size of the single focusing lens is increased, aberration may inevitably occur. In order to solve this problem, therefore, a prism is disposed between the collimating lenses and the focusing lens to reduce the distance between the collimated light beams. That is, in the conventional optical apparatus using the light sources, a complicated optical system, including collimating lenses, a prism, and a focusing lens, is required, whereby the structure of the optical apparatus may be complicated and the quality of a spot formed on a single point may be deteriorated.

DISCLOSURE

Technical Problem

Embodiments provide a light emitting apparatus that is simply realized and has improved reliability.

Technical Solution

In one embodiment, a light emitting apparatus may include a light source unit for emitting a plurality of excitation light beams having linearity, a first reflection unit for reflecting the excitation light beams incident thereon in an incident direction parallel to an axis of symmetry while having linearity and collecting the reflected excitation light beams on a focus position, and a wavelength conversion unit disposed on the focus position for transmitting the excitation light beams reflected and collected by the first reflection unit.

For example, the wavelength conversion unit may convert the wavelengths of the excitation light beams reflected and collected by the first reflection unit, and the light emitting apparatus may further include a second reflection unit for reflecting and outputting converted light beams transmitted through the wavelength conversion unit while having the wavelengths converted by the wavelength conversion unit.

For example, the light emitting apparatus may further include a base substrate disposed between the first reflection unit and the second reflection unit, the base substrate having the focus position.

For example, the light emitting apparatus may further include a lens unit disposed between the light source unit and the first reflection unit for collimating the excitation light beams emitted from the light source unit.

For example, the light emitting apparatus may further include a refraction member disposed between the first reflection unit and the wavelength conversion unit so as to occupy an entire space through which the excitation light beams pass.

For example, the refraction member may include a first round surface that faces the first reflection unit, a second surface having a first part that faces the wavelength conversion unit, and a third surface on which the excitation light beams are incident.

For example, the light emitting apparatus may further include an adhesive unit disposed between the first part of the second surface of the refraction member and the wavelength conversion unit. The third surface of the refraction member may be perpendicular to the axis of symmetry. The refraction member may include a light-transmissive material. A first refractive index of the refraction member may be different from a second refractive index of the wavelength conversion unit. The first refractive index may range from 1.4 to 1.8.

For example, the light source unit may include a plurality of light sources arranged in at least one selected from between a vertical direction and a horizontal direction while facing the first reflection unit for emitting the excitation light beams. The first reflection unit may include a parabolic surface for reflecting the excitation light beams. The parabolic surface may be mirror-coated with metal, or may have a tilt appropriate for totally reflecting the excitation light beams to the focus position.

For example, the first reflection unit may have a semicircular sectional shape, a sectional shape obtained by cutting at least one selected from between the side part and the lower part of the semicircular sectional shape, a sectional shape obtained by rotating the semicircular sectional shape by an angle of 90 degrees or less with respect to a first axis passing through the wavelength conversion unit in the horizontal direction, or a sectional shape obtained by rotating the semicircular sectional shape by an angle of 90 degrees or less with respect to a second axis passing through the wavelength conversion unit in the vertical direction, when viewed from the light source unit. In addition, the sectional shape of the first reflection unit perpendicular to the incident direction may have a cut surface. The angle at which each of the excitation light beams having linearity diverges or converges may range from 0 to 1 degree.

Advantageous Effects

A light emitting apparatus according to embodiments may be advantageous in terms of reliability, costs, and productivity, since a complicated optical system is not required. The quality of a spot formed by a plurality of excitation light beams on a wavelength conversion unit may become better than when a conventional optical system is used. The size of the focus formed on the wavelength conversion unit may not be greatly affected by the working distance, whereby freedom in the design of the structure of the light emitting apparatus may be increased. Since light beams are totally reflected by at least one selected from between first and second parabolic surfaces, it may not be necessary for the first and second parabolic surfaces to be mirror-coated with metal. Consequently, the possibility of the first and second parabolic surfaces being damaged due to concentration of the excitation light beams may be reduced. In addition, the reflectance of light beams reflected by at least one selected from between first and second parabolic surfaces may be maximized to 100%, thereby improving the reliability and efficiency of the light emitting apparatus.

BEST MODE

Figure 1:
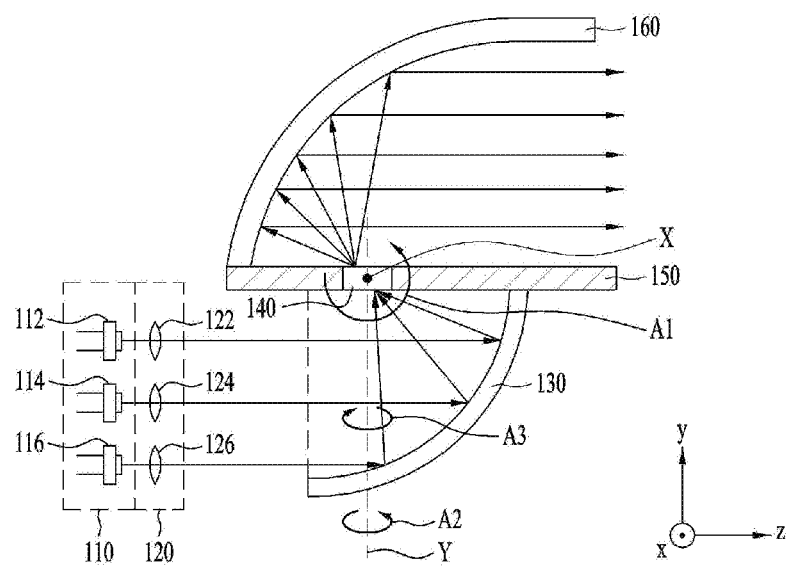
FIG. 1 is a coupled sectional view of a light emitting apparatus according to an embodiment.

Reference will now be made in detail to preferred embodiments, examples of which are illustrated in the accompanying drawings. However, the embodiments may be modified into various other forms. The embodiments are not restrictive but are illustrative. The embodiments are provided to more completely explain the disclosure to a person having ordinary skill in the art.

It will be understood that when an element is referred to as being "on" or "under" another element, it can be directly on/under the element, or one or more intervening elements may also be present.

When an element is referred to as being "on" or "under," "under the element" as well as "on the element" may be included based on the element.

In addition, relational terms, such as "first," "second," "on/upper part/above" and "under/lower part/below," are used only to distinguish between one subject or element and another subject and element, without necessarily requiring or involving any physical or logical relationship or sequence between such subjects or elements.

Hereinafter, light emitting apparatuses 100A to 100C according to embodiments will be described with reference to the accompanying drawings. For the sake of convenience, the light emitting apparatuses 100A to 100C will be described using a Cartesian coordinate system (x, y, z). However, the disclosure is not limited thereto. That is, other different coordinate systems may be used. In the drawings, an x-axis, a y-axis, and a z-axis of the Cartesian coordinate system are perpendicular to each other. However, the disclosure is not limited thereto. That is, the x-axis, the y-axis, and the z-axis may cross each other.

Figure 2:
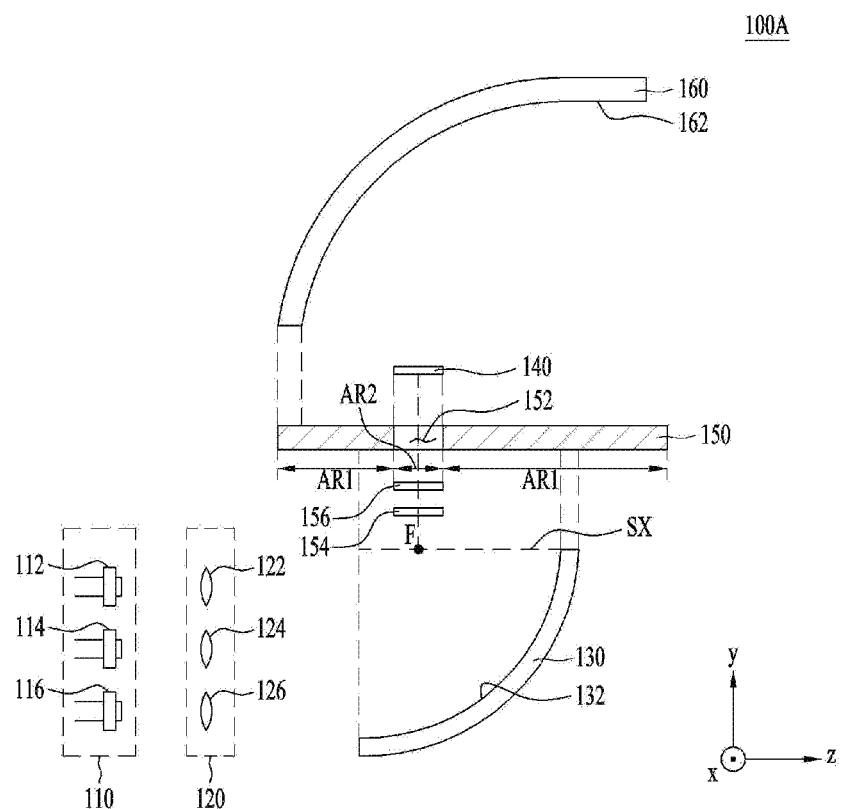
FIG. 2 is an exploded sectional view of the light emitting apparatus shown in FIG. 1.

FIG. 1 is a coupled sectional view of a light emitting apparatus 100A according to an embodiment, and FIG. 2 is an exploded sectional view of the light emitting apparatus 100A shown in FIG. 1.

Referring to FIGS. 1 and 2, the light emitting apparatus 100A according to the embodiment may include a light source unit 110, a lens unit 120, a first reflection unit 130, a wavelength conversion unit 140, a base substrate 150, and a second reflection unit 160.

The light source unit 110 may emit a plurality of excitation light beams. To this end, the light source unit 110 may include a plurality of light sources for emitting a plurality of excitation light beams.

Hereinafter, as shown in FIGS. 1 and 2, the light source unit 110 will be described as including three light sources 112, 114, and 116. However, the following description may also apply to the case in which the light source unit 110 includes fewer or more than three light sources.

In addition, each of the light sources 112, 114, and 116 may be a light emitting diode or a laser diode (LD) for emitting an excitation light beam. However, the disclosure is not limited as to the kind of the light sources 112, 114, and 116.

Particularly, in the case in which each of the light sources 112, 114, and 116 is realized using a laser diode, it is possible to achieve higher luminance and efficiency than when using a light emitting diode. In addition, in the case in which the light emitting apparatus 100A is used in a headlamp for vehicles, each of the light sources 112, 114, and 116 may be realized using a laser diode, rather than a light emitting diode, in order to emit a sufficient amount of light. However, the disclosure is not limited thereto.

In addition, the excitation light beam emitted from each of the light sources 112, 114, and 116 may have a peak wavelength within a wavelength band of 400 nm to 500 nm. However, the disclosure is not limited as to the wavelength band of the excitation light beam In addition, each of the light sources 112, 114, and 116 may emit an excitation light beam having a spectral full width at half maximum (SFWHM) of 10 nm or less. This corresponds to the width of intensity for each wavelength. However, the disclosure is not limited to any specific value of SFWHM. The spectral full width at half maximum (SFWHM) of the excitation light beam emitted from each of the light sources 112, 114, and 116 and incident on the wavelength conversion unit 140 may be 3 nm or less. However, the disclosure is not limited thereto.

In addition, the excitation light beam emitted from each of the light sources 112, 114, and 116 may have linearity. Alternatively, the excitation light beam emitted from each of the light sources 112, 114, and 116 may be configured to have linearity using the lens unit 120, even though the excitation light beam emitted from each of the light sources 112, 114, and 116 does not have linearity. As long as the excitation light beam emitted from each of the light sources 112, 114, and 116 is output to the first reflection unit 130 while having linearity, there is no particular restriction as to the type of each of the light sources 112, 114, and 116, the type of the lens unit 120, or the presence or absence of the lens unit 120. Here, that the excitation light beam has linearity may mean that the angle at which the excitation light beam diverges or converges is 0 to 1 degrees. In addition, that the angle at which the excitation light beam diverges or converges is 0 to 1 degrees may mean that the extent to which the excitation light beam spreads with respect to an optical axis of each of the light sources 112, 114, and 116 is 0 to 0.5 degrees.

The lens unit 120 may be disposed between the light source unit 110 and the first reflection unit 130 to collimate the excitation light beams emitted from the light sources 112, 114, and 116. The lens unit 120 may include collimating lenses 122, 124, and 126, the number of which corresponds to the number of light sources 112, 114, and 116 included in the light source unit 110. That is, one collimating lens may be assigned to each of the light sources 112, 114, and 116. In FIGS. 1 and 2, the collimating lenses 122, 124, and 126 may be assigned respectively to the light sources 112, 114, and 116 to collimate the excitation light beams emitted from the light sources 112, 114, and 116 and to output the collimated light beams to the first reflection unit 130. That is, the first collimating lens 122 may collimate the excitation light beam emitted from the first light source 112, the second collimating lens 124 may collimate the excitation light beam emitted from the second light source 114, and the third collimating lens 126 may collimate the excitation light beam emitted from the third light source 116.

Meanwhile, the first reflection unit 130 reflects a plurality of excitation light beams incident thereon in an incident direction (e.g. the z-axis direction) while having linearity and collects the reflected excitation light beams on a focus position F. The incident direction may be a direction parallel to an axis of symmetry SX of the first reflection unit 130. The axis of symmetry SX may be an axis on which the focus position F is located. A line extending from the top surface of the first reflection unit 130 in the horizontal direction (e.g. the z-axis direction) may be parallel to the axis of symmetry SX. In addition, in the case in which the first reflection unit 130 is parabolic, the focus position F may be a parabolic focus position.

When a plurality of excitation light beams having linearity, emitted from the light sources 112, 114, and 116, is incident in the direction parallel to the axis of symmetry SX, the first reflection unit 130 may reflect the excitation light beams emitted from the light sources 112, 114, and 116 and may collect the reflected excitation light beams on a point of the focus position F. The first reflection unit 130 may be disposed in the state of being fixed to the base substrate 150. The base substrate 150 may be disposed between the first reflection unit 130 and the second reflection unit 160, and may directly face the first and second reflection units 130 and 160.

Figure 6:
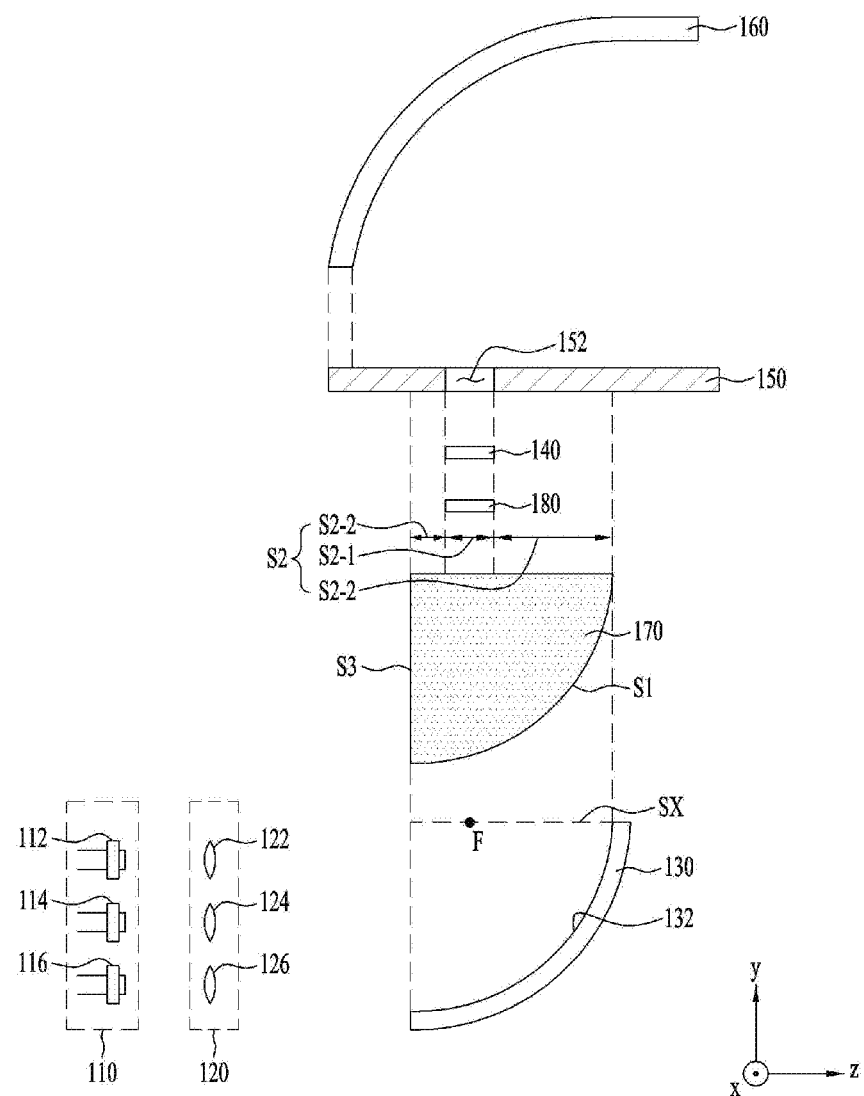
FIG. 6 is an exploded sectional view of the light emitting apparatus shown in FIG. 5.

The base substrate 150 may include a through hole 152, through which the wavelength conversion unit 140 is inserted. In addition, the base substrate 150 may include first and second areas AR1 and AR2. The first area AR1 of the base substrate 150 may include an area that faces a second part S2-2 of a second surface S2 of a first refraction member 170, which is shown in FIG. 6, excluding a first part S2-1 of the second surface S2. The second area AR2 of the base substrate 150 may be an area which is adjacent to the first area AR1 and in which the wavelength conversion unit 140 is disposed. That is, the second area AR2 of the base substrate 150 may be an area in which the focus position F, on which the excitation light beams reflected by the first reflection unit 130 are collected, is located, and may include a first through hole 152.

In addition, the base substrate 150 may face the first reflection unit 130 with interposing a first reflection layer (not shown) therebetween, and may face the second reflection unit 160 with interposing a second reflection layer (not shown) therebetween. Each of the first and second reflection layers may be attached to the wavelength conversion unit 140 or the base substrate 150 in a film form or in a coated form. If the reflectance of each of the first and second reflection layers is less than 60%, the reflection layer cannot sufficiently perform its function. Consequently, the reflectance of each of the first and second reflection layers may range from 60% to 100%. However, the disclosure is not limited thereto. According to the circumstances, the first and second reflection layers may be omitted, as shown in FIGS. 1 and 2.

The first reflection unit 130 may include a first parabolic surface 132 for reflecting the excitation light beams emitted from the light source unit 110.

In an embodiment, the first parabolic surface 132 of the first reflection unit 130 may be mirror-coated with metal. When the first parabolic surface is mirror-coated with metal, the excitation light beams may be reflected by the first parabolic surface 132 and may be collected on the focus position F.

In another embodiment, the first parabolic surface 132 may have a tilt appropriate for totally reflecting the excitation light beams such that the excitation light beams can be collected on the focus position F. In this case, it may be not necessary for the first parabolic surface 132 to be mirror-coated with metal.

Figure 3:
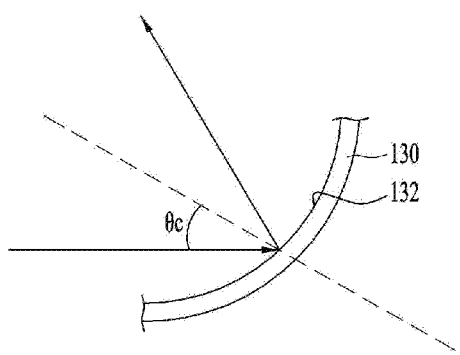
FIG. 3 is a view illustrating the tilt of a first reflection unit shown in FIGS. 1 and 2.

FIG. 3 is a view illustrating the tilt of the first reflection unit 130 shown in FIGS. 1 and 2.

When an excitation light beam is incident on the first reflection unit 130 within a tilt range of the first parabolic surface 132 of the first reflection unit 130 ranging from 0 degrees to a specific tilt, i.e. the maximum tilt, total reflection may occur. The maximum tilt, which is a tilt corresponding to a total reflection angle θc, may be calculated from tan(90°−θc), which will be described herein in more detail.

First, the tilt of the first parabolic surface 132 of the first reflection unit 130 may be known from Equation 2, which is a differential value y' of Equation 1 as follows.

$$y^2 = 4pz \quad \text{Equation 1}$$

$$y' = \frac{4p}{2y} = \frac{4p}{2\sqrt{4pz}} = \sqrt{\frac{p}{z}} \quad \text{Equation 2}$$

In Equations 1 and 2, p indicates the focal distance, and z indicates optical-axis coordinates.

It can be seen from Equation 2 that when the square root of the ratio of the focal distance p to the optical-axis coordinates z is between 0 and the maximum tilt, total reflection may occur on the first parabolic surface 132. As will be described below with reference to FIGS. 5 and 6, in the case in which light emitting apparatus 100B includes a first refraction member 170, the relationship between the total reflection angle θc and the maximum tilt based on a first refractive index n1 of the first refraction member 170 is as shown in Table 1.

TABLE 1

| Refractive index | Total reflection angle | Maximum tilt |
|---|---|---|
| 1.4 | 45.58 | 0.9798 |
| 1.5 | 41.81 | 1.1180 |
| 1.6 | 38.68 | 1.2490 |
| 1.7 | 36.03 | 1.3748 |
| 1.8 | 33.75 | 1.4967 |

As can be seen from Equation 2 and Table 1, the tilt of the first reflection unit 130 for total reflection may range from 0 to 1.5. However, the disclosure is not limited thereto.

Hereinafter, various shapes of embodiments of the first reflection unit 130 will be described with reference to FIGS. 4a to 4g.

FIGS. 4a to 4g are views showing various sectional shapes of embodiments of the first reflection unit 130.

Figure 4A:
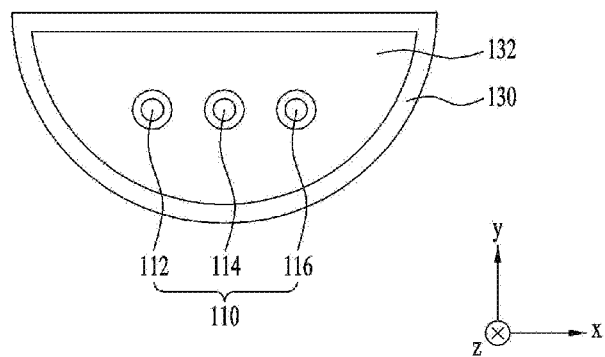
FIGS. 4*a* to 4*g* are views showing various sectional shapes of embodiments of the first reflection unit.
Figure 4B:
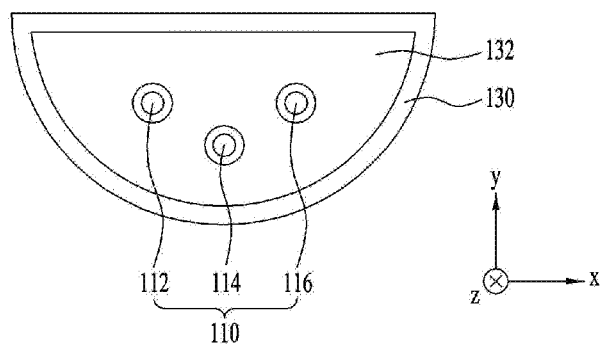

As shown in FIG. 4a or 4b, the first reflection unit 130 may have a semicircular sectional shape, when viewed from the light source unit 110 in the direction of the axis of symmetry, i.e. the z-axis direction.

In an embodiment, in the case in which the light source unit 110 includes a plurality of light sources 112, 114, and 116, the light sources 112, 114, and 116 may be arranged in the vertical direction (e.g. the y-axis direction) while facing the first parabolic surface 132 of the first reflection unit 130, as shown in FIGS. 1 and 2.

In another embodiment, the light sources 112, 114, and 116 may be arranged in the horizontal direction (e.g. the x-axis direction) while facing the first parabolic surface 132 of the first reflection unit 130, as shown in FIG. 4a.

In a further embodiment, the light sources 112, 114, and 116 may be arranged in the vertical direction (e.g. the y-axis direction) and the horizontal direction (e.g. the x-axis direction) while facing the first parabolic surface 132 of the first reflection unit 130. For example, as shown in FIG. 4b, the light sources 112 and 116 may be arranged in the horizontal direction (e.g. the x-axis direction) while facing the first parabolic surface 132 of the first reflection unit 130, and the light source 114 may be oriented in the direction perpendicular to the light sources 112 and 116, i.e. the vertical direction (e.g. the y-axis direction).

Figure 4C:
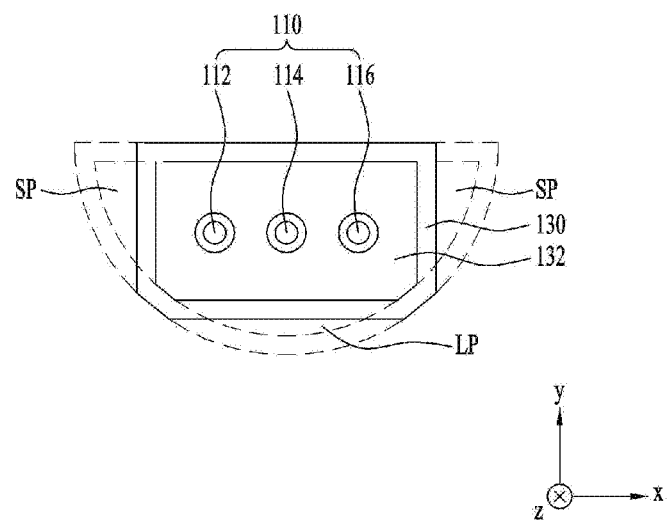

In addition, the sectional shape of the first reflection unit 130, when viewed from the light source unit 110, may be obtained by cutting at least one selected from between the side part and the lower part of the semicircular sectional shape shown in FIG. 4a or 4b. For example, as shown in FIG. 4c, the sectional shape of the first reflection unit 130 when viewed from the light source unit 110 may be obtained by cutting both the side part SP and the lower part LP of the semicircular sectional shape. Alternatively, unlike what is shown in FIG. 4c, the sectional shape of the first reflection unit 130 when viewed from the light source unit 110 may be obtained by cutting only the side part SP of the semicircular sectional shape, without cutting the lower part LP.

Figure 4D:
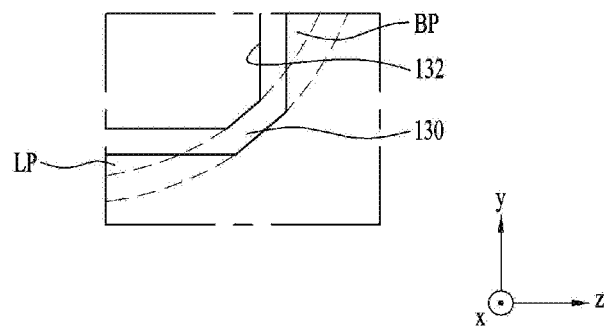

In addition, as shown in FIG. 4d, the sectional shape of the first reflection unit 130 perpendicular to the incident direction (e.g. the z-axis direction) may have a cut surface obtained by cutting the back part BP of the semicircular sectional shape.

Figure 4E:
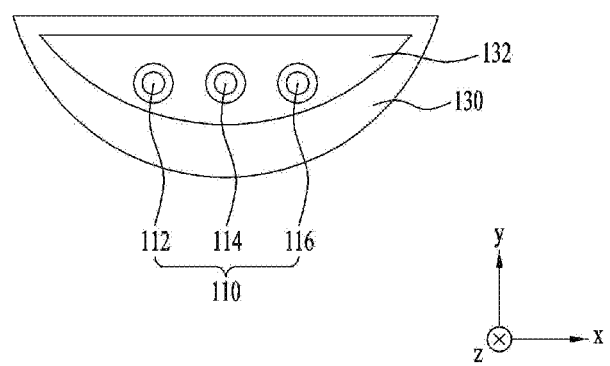

In addition, the sectional shape of the first reflection unit 130 when viewed from the light source unit 110 may be obtained by rotating the semicircular sectional shape shown in FIG. 4a or 4b by an angle of 90 degrees or less (or a zenith angle) with respect to a first axis (e.g. the x-axis X shown in FIG. 1) passing through the wavelength conversion unit 140 in the horizontal direction (i.e. the direction perpendicular to the thickness direction of the wavelength conversion unit 140). For example, as shown in FIG. 4e, the sectional shape of the first reflection unit 130 when viewed from the light source unit 110 may be obtained by rotating the semicircular sectional shape by an angle of 15 degrees or less with respect to the first axis X in the direction indicated by arrow A1.

Figure 4F:
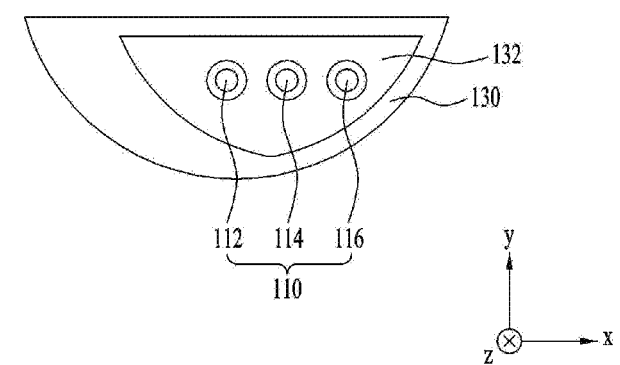
Figure 4G:
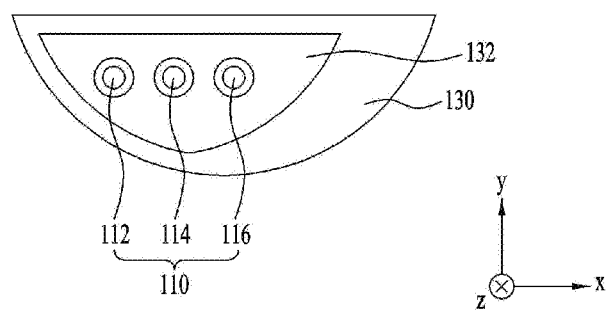

In addition, the sectional shape of the first reflection unit 130 when viewed from the light source unit 110 may be obtained by rotating the semicircular sectional shape shown in FIG. 4a or 4b by an angle of 90 degrees or less (or a zenith angle) with respect to a second axis (e.g. the y-axis Y shown in FIG. 1) passing through the wavelength conversion unit 140 in the vertical direction (i.e. the thickness direction of the wavelength conversion unit 140). For example, as shown in FIG. 4f, the sectional shape of the first reflection unit 130 when viewed from the light source unit 110 may be obtained by rotating the semicircular sectional shape by an angle of 15 degrees or less with respect to the second axis Y in the direction indicated by arrow A2. Alternatively, as shown in FIG. 4g, the sectional shape of the first reflection unit 130 when viewed from the light source unit 110 may be obtained by rotating the semicircular sectional shape by an angle of 15 degrees or less with respect to the second axis Y in the direction indicated by arrow A3.

The sectional shape of the first reflection unit 130 when viewed from the light source unit 110 is not limited to those shown in FIGS. 4a to 4c and 4e to 4g. That is, as long as the excitation light beams emitted from the light source unit 110 can be incident in the incident direction and then reach the focus position F, only a portion of the first parabolic surface 132 shown in FIGS. 4a and 4b may be used, or the first reflection unit 130 may have various sectional shapes.

Meanwhile, the light emitting apparatus 100A may not include the wavelength conversion unit 140. If the light emitting apparatus 100A does not include the wavelength conversion unit 140, the second reflection unit 160 may reflect and output the excitation light beams, incident in the incident direction while having linearity and collected on the focus position by the first reflection unit 130.

Hereinafter, the case in which the light emitting apparatus 100A includes the wavelength conversion unit 140 will be described.

The wavelength conversion unit 140 is disposed on the focus position F of the first reflection unit 130. The wavelength conversion unit 140 transmits the excitation light beams, reflected by the first reflection unit 130 and collected on the focus position F, to convert the wavelengths of the excitation light beams, and outputs the light beams having converted wavelengths (hereinafter, referred to as "converted light beams"). While the excitation light beams passing through the wavelength conversion unit 140, the wavelengths of the excitation light beams may be converted. However, not all of the light beams transmitted through the wavelength conversion unit 140 may be light beams having converted wavelengths.

Referring to FIG. 2, the wavelength conversion unit 140 may be disposed with being inserted in the through hole 152 in the base plate 150.

The wavelength conversion unit 140 may be a set of numberless point light sources, and each point light source may absorb an excitation light beam and emit a converted light beam.

In general, for a reflective-type wavelength conversion unit, the optical path of an excitation light beam and the optical path of a converted light beam overlap each other. For this reason, it is difficult to configure an excitation light beam optical system such that the excitation light beam optical system does not interfere with the optical path of the converted light beam. In addition, in the case in which a portion of the lighting optical system is not used, lighting efficiency is reduced. In the case in which the excitation light beam is very obliquely incident, the spot size of the focus is increased, thereby defeating the purpose of using the laser diode as the light source.

However, since the wavelength conversion unit 140 shown in FIGS. 1 and 2 is of a transmissive type, rather than a reflective type, the optical path of an excitation light beam and the optical path of a converted light beam do not overlap each other. Consequently, the structure of the optical system is simpler than that of the reflective-type optical system, thereby easily implementing the optical system. Furthermore, it is possible to collect a plurality of excitation light beams on the focus position F of the wavelength conversion unit 140 using the first reflection unit 130 in place of the complicated optical system.

In addition, the reflective-type wavelength conversion unit has problems in that it is difficult to block blue laser light that is not incident on the wavelength conversion unit but is mirror-reflected by the surface of the wavelength conversion unit and in that the laser light may be exposed to the outside when the apparatus is out of order, whereby the safety of the reflective-type wavelength conversion unit is low. In the transmissive-type wavelength conversion unit 140, on the other hand, there is no possibility of the blue laser light being exposed to the outside as long as no hole is formed in the wavelength conversion unit 140, whereby the safety of the wavelength conversion unit is high. Furthermore, blue excitation light beams are not mixed with each other. Consequently, the transmissive-type wavelength conversion unit may be more advantageous than the reflective-type wavelength conversion unit in terms of color distribution.

Meanwhile, the wavelengths of the excitation light beams emitted from the light sources 112, 114, and 116 may be converted by the wavelength conversion unit 140, with the result that white light or light having a desired color temperature may be output from the light emitting apparatus 100A. To this end, the wavelength conversion unit 140 may include at least one selected from among phosphor, such as ceramic phosphor, lumiphore, and YAG single-crystal. Here, lumiphore may be a luminescent material or a structure including such a luminescent material.

In addition, the concentration, particle size, and particle size distribution of various materials included in the wavelength conversion unit 140, the thickness of the wavelength conversion unit 140, the surface roughness of the wavelength conversion unit 140, and air bubbles in the wavelength conversion unit 140 may be adjusted to output light having a desired color temperature from the light emitting apparatus 100A. For example, the wavelength conversion unit 140 may convert a wavelength band of light ranging from 3000 K to 9000 K in terms of color temperature. That is, the color temperature range of a converted light beam that has a wavelength converted by the wavelength conversion unit 140 may range from 3000 K to 9000 K. However, the disclosure is not limited thereto.

In addition, the wavelength conversion unit 140 may have any of various shapes. For example, the wavelength conversion unit 140 may be a phosphor-in-glass (PIG) type wavelength conversion unit, a poly crystal-line (or ceramic) type wavelength conversion unit, or a single crystal-line type wavelength conversion unit.

Meanwhile, the second reflection unit 160 may be disposed in the state of being fixed to the base substrate 150, like the first reflection unit 130. The second reflection unit 160 may reflect the converted light beams transmitted through the wavelength conversion unit 140, and may output the reflected light beams. The second reflection unit 160 has a second parabolic surface 162. The second parabolic surface 162 may have characteristics similar to those of the first parabolic surface 132. That is, in an embodiment, the second parabolic surface 162 may be mirror-coated with metal to reflect the converted light beams. In another embodiment, the second parabolic surface 162 may have a tilt appropriate for totally reflecting the converted light beams. In this case, the second parabolic surface 162 may not be mirror-coated with metal. The descriptions on the total reflection on the first parabolic surface 132 may be equally applied to the total reflection on the second parabolic surface 162.

In addition, each of the first and second reflection units 130 and 160 may include at least one selected from among an aspherical surface, a freeform curve surface, a Fresnel lens, and a holography optical element (HOE) depending on desired luminance distribution. Here, the freeform curved surface may be a shape having various curved surfaces.

In addition, the light emitting apparatus 100A may further include a heat dissipation substrate 154 as shown in FIG. 2. The heat dissipation substrate 154 is omitted from FIG. 1.

The heat dissipation substrate 154 may be adhered to the light incident surface of the wavelength conversion unit 140 for heat dissipation. For example, the heat dissipation substrate 154 may be made of a metal material or alumina ($Al_2O_3$). However, the disclosure is not limited thereto. That is, any material that is capable of dissipating heat may be used as the heat dissipation substrate 154.

In the case in which the heat dissipation substrate 154 is adhered to the light incident surface of the wavelength conversion unit 140, however, the incidence efficiency of the excitation light beams may be reduced. In order to minimize or prevent this, the light emitting apparatus 100A may further include a dichroic short pass filter (DSPF) 156. The dichroic short pass filter 156 is omitted from FIG. 1.

In order to minimize or prevent a reduction in the efficiency at which the excitation light beams are incident on the wavelength conversion unit 140, the dichroic short pass filter 156 may be disposed between the wavelength conversion unit 140 and the heat dissipation substrate 154. For example, the dichroic short pass filter 156 may be deposited or adhered to the wavelength conversion unit 140 or the heat dissipation substrate 154. However, the disclosure is not limited to any form of coupling between the dichroic short pass filter 156 and the wavelength conversion unit 140 or coupling between the dichroic short pass filter 156 and the heat dissipation substrate 154.

Figure 5:
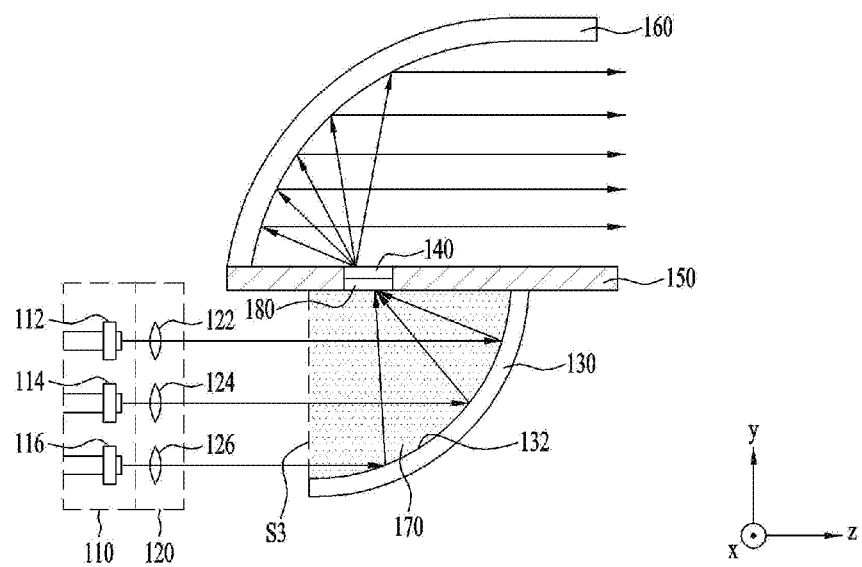
FIG. 5 is a coupled sectional view of a light emitting apparatus according to another embodiment.

FIG. 5 is a coupled sectional view of a light emitting apparatus 100B according to another embodiment, and FIG. 6 is an exploded sectional view of the light emitting apparatus 100B shown in FIG. 5.

The light emitting apparatus 100B shown in FIGS. 5 and 6 may include a light source unit 110, a lens unit 120, a first reflection unit 130, a wavelength conversion unit 140, a base substrate 150, a second reflection unit 160, a first refraction member 170, and a first adhesive unit 180. Unlike the light emitting apparatus 100A shown in FIGS. 1 and 2, the light emitting apparatus 100B shown in FIGS. 5 and 6 may further include the first refraction member 170 and the first adhesive unit 180. With this exception, the light emitting apparatus 100B shown in FIGS. 5 and 6 is identical to the light emitting apparatus 100A shown in FIGS. 1 and 2. Consequently, the same reference numerals as in FIGS. 1 and 2 are used in FIGS. 5 and 6, and a duplicate description thereof will be omitted. That is, the light source unit 110, the lens unit 120, the first reflection unit 130, the wavelength conversion unit 140, the base substrate 150, and the second reflection unit 160 shown in FIGS. 5 and 6 correspond to the light source unit 110, the lens unit 120, the first reflection unit 130, the wavelength conversion unit 140, the base substrate 150, and the second reflection unit 160 shown in FIGS. 1 and 2, respectively.

The first refraction member 170 may be disposed between the first reflection unit 130 and the wavelength conversion unit 140, and may be located so as to occupy the entire space through which a plurality of excitation light beams passes to refract the excitation light beams reflected by the first reflection unit 130. As shown in FIG. 5, the base substrate 150 may directly contact the first refraction member 170. Alternatively, a first reflection layer (not shown) may be disposed between the base substrate 150 and the first refraction member 170, as previously described.

Referring to FIG. 6, the first refraction member 170 may include first, second, and third surfaces S1, S2, and S3.

The first surface S1 may be a surface that faces a first parabolic surface 132 of the first reflection unit 130. The first surface S1 may be round (or parabolic).

The second surface S2 may include a first part S2-1 and a second part S2-2. The first part S2-1 may be a part that faces the wavelength conversion unit 140. In addition, the second part S2-2 may be a part that faces the base substrate 150.

The third surface S3 may be a surface on which a plurality of excitation light beams emitted from the light source unit 110 and passing through the lens unit 120 is incident. The third surface S3 of the first refraction member 170 may be perpendicular to an axis of symmetry SX. In the case in which the third surface S3 is perpendicular to the axis of symmetry SX, the incidence paths of the excitation light beams are not refracted at the boundary surface S3, and the excitation light beams incident on the parabolic surface 132 are parallel to each other, whereby the linearity of the excitation light beams may be improved. When the linearity is improved, the first reflection unit 130 may reflect the excitation light beams such that the excitation light beams are collected on a focus position F while having a much smaller size.

A first adhesive unit 180 may be further disposed between the first part S2-1 of the second surface S2 of the first refraction member 170 and the wavelength conversion unit 140. The first adhesive unit 180 may be disposed between the first part S2-1 of the second surface S2 of the first refraction member 170 and the wavelength conversion unit 140. The first adhesive unit 180 may include at least one selected from among sintered or fired polymer, $Al_2O_3$, and $SiO_2$. As described above, the first part S2-1 of the second surface S2 of the first refraction member 170 and the wavelength conversion unit 140 may be adhered to each other via the first adhesive unit 180. However, the disclosure is not limited thereto.

Since the first refraction member 170 is disposed in the entire space through which the excitation light beams pass, as described above, no air may be present in the space through which the excitation light beams pass. As a result, the excitation light beams may advance to the first reflection unit 130 via the first refraction member 170 without being exposed to the air, and the excitation light beams reflected by the first reflection unit 130 may reach the focus position F of the wavelength conversion unit 140 via the first refraction member 170.

In addition, a first refractive index n1 of the first refraction member 170 may be different from a second refractive index n2 of the wavelength conversion unit 140. As the difference Δn between the first refractive index n1 of the first refraction member 170 and the second refractive index n2 of the wavelength conversion unit 140 is smaller, the extent to which the optical extraction efficiency of the light emitting apparatus 100B is improved may further increase. However, if the difference Δn between the first and second refractive indices n1 and n2 is large, the extent to which the optical extraction efficiency of the light emitting apparatus 100B is improved may decrease. The materials for the wavelength conversion unit 140 and the first refraction member 170 may be selected in consideration thereof. For example, the first refraction member 170 may include at least one selected from among $Al_2O_3$ single crystal, $Al_2O_3$ glass and $SiO_2$ glass.

In addition, the second refractive index n2 may be changed depending on the type of the wavelength conversion unit 140. In the case in which the wavelength conversion unit 140 is of a PIG type, the second refractive index n2 may range from 1.3 to 1.7. In the case in which the wavelength conversion unit 140 is of a poly crystal-line type, the second refractive index n2 may range from 1.5 to 2.0. In the case in which the wavelength conversion unit 140 is of a single crystal-line type, the second refractive index n2 may range from 1.5 to 2.0. That is, the second refractive index n2 may range from 1.3 to 2.0. However, the disclosure is not limited thereto.

In addition, the case in which the thermal conductivity of the first refraction member 170 is high may be advantageous in dissipating heat generated from the wavelength conversion unit 140. The thermal conductivity thereof may be changed depending on the kind of the material for the first refraction member 170 and on a reference temperature (i.e. the temperature of the surrounding environment). In consideration thereof, the first refraction member 170 may include a material having a thermal conductivity of 1 W/mK to 50 W/mK and/or a reference temperature of 20K to 400K. Since optical extraction efficiency and heat dissipation characteristics are determined depending on the kind of material for the first refraction member 170, as described above, the material for the first refraction member 170 may be determined in consideration thereof.

In the case in which the light emitting apparatus 100A does not include the first refraction member 170, as shown in FIGS. 1 and 2, optical loss may inevitably occur according to the Fresnel equation while the light beams reflected by the first reflection unit 130 advance to the wavelength conversion unit 140. The reason for this is that a total internal reflection (TIR) angle is small due to the difference in refractive index between air, present between the wavelength conversion unit 140 and the parabolic surface 132, and the wavelength conversion unit 140, whereby light reflected from the parabolic surface 132 at a small angle may reach the wavelength conversion unit 140. Furthermore, in the case in which devices that emit excitation light beams having high integration and linearity, such as laser diodes, are used as the light sources 112, 114, and 116, the difference in refractive index between the wavelength conversion unit 140 and the air may further increase, whereby optical loss may further increase. The reason for this is that when laser diodes are used, there is no appropriate material for the wavelength conversion unit 140, excluding single/poly crystal-line type materials having high refractive indices.

However, in the case in which the light emitting apparatus 100B includes the first refraction member 170, as shown in FIGS. 5 and 6, the aforementioned optical loss may be reduced while the excitation light beams reflected by the first reflection unit 130 advance to the wavelength conversion unit 140. In consideration thereof, the first refraction member 170 may be made of a material having a refractive index similar to that of air. In the case in which the first refraction member 170 is made of a material having a refractive index similar to that of air, the light beams reflected by the first reflection unit 130 may reach the wavelength conversion unit 140 without loss. For example, the first refractive index n1 may range from 1.4 to 1.8. However, the disclosure is not limited thereto.

In addition, the first reflection unit 130 and the first refraction member 170 may be integrally formed. In this case, the first refraction member 170 may function as a reflector as well as a lens. In the case in which first reflection unit 130 and the first refraction member 170 are integrally formed, there may be no possibility of the converted light beams advancing from the first reflection unit 130 to the wavelength conversion unit 140 to contact air.

In addition, the first refraction member 170 and the base substrate 150 may have at least one selected from between a two-dimensional pattern and a three-dimensional pattern depending on the desired illuminance distribution to be realized in the light emitting apparatus 100B.

In addition, the first refraction member 170 may include a light-transmissive material. However, the disclosure is not limited thereto.

Figure 7:
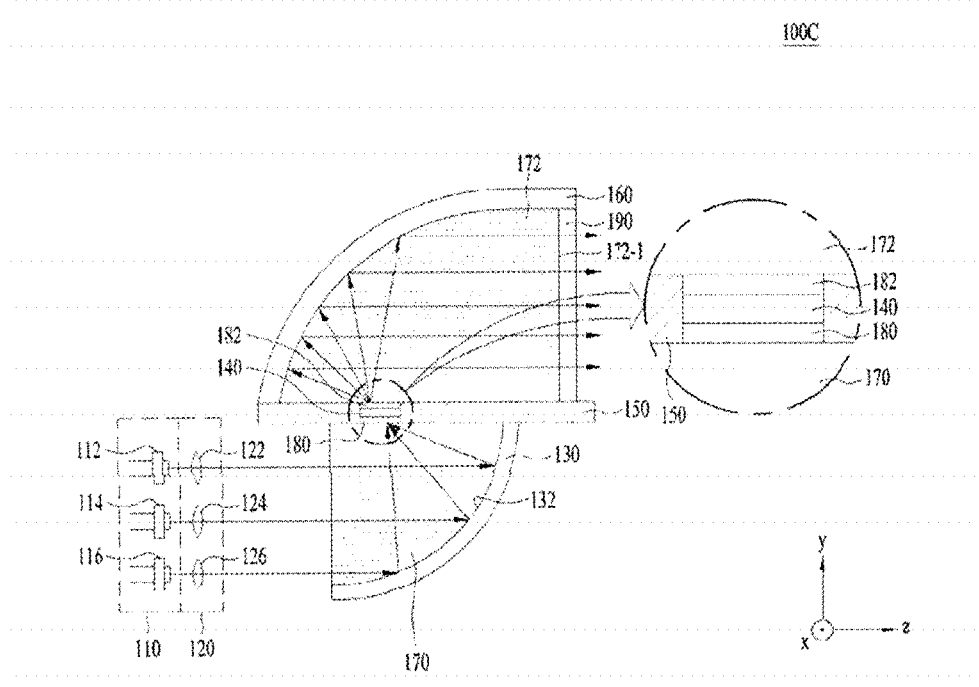
FIG. 7 is a sectional view of a light emitting apparatus according to a further embodiment.

FIG. 7 is a sectional view of a light emitting apparatus 100C according to a still another embodiment.

The light emitting apparatus 100C shown in FIG. 7 may include a light source unit 110, a lens unit 120, a first reflection unit 130, a wavelength conversion unit 140, a base substrate 150, a second reflection unit 160, first and second refraction members 170 and 172, first and second adhesive units 180 and 182, and an anti-reflection film 190.

Unlike the light emitting apparatus 100B shown in FIG. 5, the light emitting apparatus 100C shown in FIG. 7 may further include the second refraction member 172, the second adhesive unit 182, and the anti-reflection film 190. With this exception, the light emitting apparatus 100C shown in FIG. 7 is identical to the light emitting apparatus 100B shown in FIG. 5. Consequently, the same reference numerals as in FIG. 5 are used in FIG. 7, and a duplicate description thereof will be omitted. That is, the light source unit 110, the lens unit 120, the first reflection unit 130, the wavelength conversion unit 140, the base substrate 150, the second reflection unit 160, the first refraction member 170, and the first adhesive unit 180 shown in FIG. 7 correspond to the light source unit 110, the lens unit 120, the first reflection unit 130, the wavelength conversion unit 140, the base substrate 150, the second reflection unit 160, the first refraction member 170, and the first adhesive unit 180 shown in FIG. 5, respectively.

The second refraction member 172 may be disposed between the second reflection unit 160 and the wavelength conversion unit 140, and may be located so as to occupy the entire space through which converted light beams pass. The second refraction member 172 may exhibit the same characteristics as the first refraction member 170, and therefore a duplicate description thereof will be omitted.

The second adhesive unit 182 may be disposed between the wavelength conversion unit 140 and the second refraction member 172. Like the first adhesive unit 180, the second adhesive unit 182 may include at least one selected from among sintered or fired polymer, $Al_2O_3$, and $SiO_2$. The second refraction member 172 and the wavelength conversion unit 140 may be adhered to each other via the second adhesive unit 182. However, the disclosure is not limited thereto. The wavelength conversion unit 140 may be disposed between the first adhesive unit 180 and the second adhesive unit 182. According to circumstances, the first and second refraction members 170 and 172 may be omitted.

The anti-reflection film 190 may be disposed at a light output surface 172-1 of the second refraction member 172. The anti-reflection film 190 may be disposed at a boundary surface 172-1 at which light beams output from the second refraction member 172 contact air. According to circumstances, the anti-reflection film 190 may be omitted.

Generally, in the case in which a light emitting apparatus includes a plurality of light sources, there is no other way but to adopt a complicated optical system. The reason for this is that the optical system of the light emitting apparatus should include at least collimating lenses, a focus lens, and a prism. Furthermore, in the case in which laser diodes are used as the light sources, excitation light beams incident and collected on the wavelength conversion unit 140 must form a very small spot having a size of 100 μm. Consequently, a complicated and sophisticated optical system is required. Generally, in the case in which the light emitting apparatus is used in a headlamp for vehicles, the light emitting apparatus needs a plurality of light sources in order to emit a sufficient amount of light. In this case, costs related to vehicle parts may increase due to the light emitting apparatus having the complicated optical system, whereby productivity and resistance to vibrations may be reduced.

On the other hand, in the light emitting apparatuses 100A to 100C according to the embodiments, the excitation light beams may be simply collected on the focus position F of the wavelength conversion unit 140 using the first reflection unit 130. As a result, the emitting apparatuses 100A to 100C according to the embodiments do not need a complicated optical system, which is advantageous in terms of reliability, costs, and productivity. Furthermore, the quality of the spot formed by the excitation light beams on the wavelength conversion unit 140 may be better than when a conventional optical system is used.

Additionally, in the case in which it is necessary to make a distance (hereinafter, referred to as a "working distance") from the light sources 112, 114, and 116 to the wavelength conversion unit 140 to be long, the focus may increase in accordance with the principle of geometrical optics if a complicated optical system is used as in a conventional light emitting apparatus. In the light emitting apparatuses 100A, 100B, and 100C according to the embodiments, however, the size of the focus is not greatly affected by the working distance, since the excitation light beams are collected on the focus position F using the first parabolic surface 132 of the first reflection unit 130. Consequently, freedom in the design of the structure of the light emitting apparatuses 100A to 100C may be increased.

Additionally, in the case in which each of the first and second parabolic surfaces 132 and 162 of the first and second reflection units 130 and 160 is mirror-coated with metal, the first and second parabolic surfaces 132 and 162 mirror-coated with metal may be damaged, if the concentration of the excitation light beams is great. In addition, the reflectance of first and second parabolic surfaces 132 and 162 mirror-coated with metal is merely 70% to 90%. In the light emitting apparatuses 100A to 100C according to the embodiments, however, the first and second parabolic surfaces 132 and 162 may not request to be mirror-coated with metal, since the first and second parabolic surfaces 132 and 162 can reflect light beams by total reflection. Even in the case in which the excitation light beams are concentrated, therefore, the possibility of at least one of the first or second parabolic surface 132 or 162 being damaged may be reduced. In addition, the reflectance of light beams reflected by at least one of the first or second parabolic surface 132 or 162 may be maximized to 100% by total reflection. In the case in which reflectance is maximized while at least one of the first or second parabolic surface 132 or 162 is not damaged, as described above, the reliability and efficiency of the light emitting apparatus may be improved.

The light emitting apparatuses 100A to 100C according to the above-described embodiments may be used in various fields. For example, the light emitting apparatuses 100A to 100C may be used in various lamps for vehicles (e.g. a low beam, a high beam, a taillight, a side light, a signal light, a day running light (DRL), and a fog light), a flashlight, a traffic light, or various lighting devices.

Although embodiments have been described with reference to a number of illustrative embodiments thereof, it should be understood that the embodiments are illustrative and not restrictive and that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to the variations and modifications fall within the spirit and scope of the present disclosure defined in the appended claims.

Mode For Invention

Various embodiments have been described in the best mode for carrying out the invention.

INDUSTRIAL APPLICABILITY

A light emitting apparatus according to embodiments may be used in various lamps for vehicles (e.g. a low beam, a high beam, a taillight, a side light, a signal light, a day running light (DRL), and a fog light), a flashlight, a traffic light, or various lighting devices.

The invention claimed is:

1. A light emitting apparatus, comprising:
a light source unit emitting a plurality of excitation light beams having linearity;
a first reflection unit reflecting the excitation light beams incident thereon in an incident direction in parallel to an axis of symmetry while having linearity and collecting the reflected excitation light beams on a focus position;
a wavelength conversion unit disposed on the focus position for transmitting the excitation light beams reflected and collected by the first reflection unit;
a heat dissipation substrate spaced apart from the light source unit such that the excitation light beams reflected by the first reflection unit pass through the heat dissipation substrate to be incident on the wavelength conversion unit;
a light filter interposed between the wavelength conversion unit and the heat dissipation substrate; and
a base substrate having the focus position and including a through hole into which the wavelength conversion unit is inserted.

2. The light emitting apparatus according to claim 1, wherein
the wavelength conversion unit converts wavelengths of the excitation light beams reflected and collected by the first reflection unit, and
the light emitting apparatus further comprises a second reflection unit reflecting and outputting converted light beams transmitted through the wavelength conversion unit while having the wavelengths converted by the wavelength conversion unit.

3. The light emitting apparatus according to claim 2, wherein the base substrate is disposed between the first reflection unit and the second reflection unit.

4. The light emitting apparatus according to claim 1, further comprising a lens unit disposed between the light source unit and the first reflection unit collimating the excitation light beams emitted from the light source unit.

5. A light emitting apparatus, comprising:
a light source unit emitting a plurality of excitation light beams having linearity;
a first reflection unit reflecting the excitation light beams incident thereon in an incident direction in parallel to an axis of symmetry while having linearity and collecting the reflected excitation light beams on a focus position;
a wavelength conversion unit disposed on the focus position for transmitting the excitation light beams reflected and collected by the first reflection unit;
a base substrate having the focus position and including a through hole into which the wavelength conversion unit is inserted; and
a refraction member disposed between the first reflection unit and the wavelength conversion unit so as to occupy an entire space through which the excitation light beams pass.

6. The light emitting apparatus according to claim 5, wherein the refraction member comprises:
a first round surface that faces the first reflection unit;
a second surface having a first part that faces the wavelength conversion unit; and
a third surface on which the excitation light beams are incident.

7. The light emitting apparatus according to claim 6, further comprising an adhesive unit disposed between the first part of the second surface of the refraction member and the wavelength conversion unit.

8. The light emitting apparatus according to claim 6, wherein the third surface of the refraction member is perpendicular to the axis of symmetry.

9. The light emitting apparatus according to claim 5, wherein the refraction member comprises a light-transmissive material.

10. The light emitting apparatus according to claim 5, wherein a first refractive index of the refraction member is different from a second refractive index of the wavelength conversion unit.

11. The light emitting apparatus according to claim 10, wherein the first refractive index ranges from 1.4 to 1.8.

12. The light emitting apparatus according to claim 1, wherein the first reflection unit comprises a parabolic surface for reflecting the excitation light beams.

13. The light emitting apparatus according to claim 12, wherein the parabolic surface is mirror-coated with metal.

14. The light emitting apparatus according to claim 12, wherein the parabolic surface has a tilt appropriate for totally reflecting the excitation light beams to the focus position.

15. The light emitting apparatus according to claim 1, wherein the first reflection unit has a semicircular sectional shape, when viewed from the light source unit.

16. The light emitting apparatus according to claim 1, wherein the first reflection unit has a sectional shape obtained by cutting at least one selected from a side part and a lower part of a semicircular sectional shape, when viewed from the light source unit.

17. The light emitting apparatus according to claim 1, wherein a sectional shape of the first reflection unit perpendicular to the incident direction has a cut surface.

18. The light emitting apparatus according to claim 1, wherein the first reflection unit has a sectional shape obtained by rotating a semicircular sectional shape by an angle of 90 degrees or less with respect to a first axis passing through the wavelength conversion unit in a horizontal direction, when viewed from the light source unit.

19. The light emitting apparatus according to claim 1, wherein the first reflection unit has a sectional shape obtained by rotating a semicircular sectional shape by an angle of 90 degrees or less with respect to a second axis passing through the wavelength conversion unit in a vertical direction, when viewed from the light source unit.

20. The light emitting apparatus according to claim 1, wherein the light filter interposed between the wavelength conversion unit and the heat dissipation substrate is configured to inhibit incidence efficiency reduction of the excitation light beams that pass through the heat dissipation substrate and are incident on the wavelength conversion unit.

* * * * *